(12) United States Patent
Tsukagoshi

(10) Patent No.: US 9,219,026 B2
(45) Date of Patent: Dec. 22, 2015

(54) SEMICONDUCTOR DEVICE

(71) Applicant: SEIKO INSTRUMENTS INC., Chiba-shi, Chiba (JP)

(72) Inventor: Koji Tsukagoshi, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/485,918

(22) Filed: Sep. 15, 2014

(65) Prior Publication Data
US 2015/0076715 A1    Mar. 19, 2015

(30) Foreign Application Priority Data

Sep. 18, 2013    (JP) .................................. 2013-192963

(51) Int. Cl.
| | |
|---|---|
| *H01L 23/48* | (2006.01) |
| *H01L 23/52* | (2006.01) |
| *H01L 29/40* | (2006.01) |
| *H01L 23/495* | (2006.01) |
| *H01L 23/00* | (2006.01) |

(52) U.S. Cl.
CPC .... *H01L 23/49503* (2013.01); *H01L 23/49513* (2013.01); *H01L 23/49541* (2013.01); *H01L 23/49548* (2013.01); *H01L 24/00* (2013.01)

(58) Field of Classification Search
CPC .......... H01L 23/48; H01L 23/52; H01L 29/40
USPC ................................................... 257/777, 786
See application file for complete search history.

(56) References Cited

U.S. PATENT DOCUMENTS

| | | | |
|---|---|---|---|
| 2012/0020041 A1* | 1/2012 | Hosokawa ..................... 361/772 |
| 2012/0086021 A1* | 4/2012 | Wang ............................... 257/84 |
| 2013/0026655 A1* | 1/2013 | Lee et al. ....................... 257/777 |

OTHER PUBLICATIONS

Patent Abstracts of Japan, Publication No. 2006-156437, Publication Date Jun. 15, 2006.

* cited by examiner

*Primary Examiner* — Phuc Dang
(74) *Attorney, Agent, or Firm* — Adams & Wilks

(57) ABSTRACT

A semiconductor device has an island portion on which a semiconductor chip is adhered through intermediation of an insulating paste. Recessed portions having an inverted pyramid shape are formed in a semiconductor chip placing region of the island portion. A first opening angle formed by a normal extending upward from a vertex of each of the plurality of recessed portions each having an inverted pyramid shape and an opening line extending to an outer side of the semiconductor chip placing region is smaller than a second opening angle formed by the normal and an opening line extending to an inner side of the semiconductor chip placing region.

20 Claims, 6 Drawing Sheets

SEMICONDUCTOR DEVICE

BACKGROUND OF THE INVENTION

1. Field of the Invention

The present invention relates to a semiconductor device having an island portion for mounting a semiconductor chip thereon.

2. Description of the Related Art

A relatively high demand for performance of an electronic component relates to downsizing and thinning of the package. It is thus considered that while pursuing the downsizing and thinning during development, technological evolution, such as represented by material developments, structural investigations, and developments and reconsiderations of process, has been simultaneously advanced. The necessity of pursuing the downsizing and thinning of the electronic component as described above resides in that the electronic component is required to be downsized and thinned in proportion to the downsizing and thinning of the device on which the electronic component is to be mounted, which shows that the products have become diversified. In particular, for a semiconductor component, generally a resin-molded package form is often used.

A configuration of the resin-molded package can be roughly classified into a configuration using a resin substrate and an epoxy resin mold and a configuration using a lead frame and an epoxy resin mold. What is common to the downsizing and thinning of the resin-molded package using the resin substrate and the resin-molded package using the lead frame is to pursue the design with the small, fine, and thin dimensions of the respective components. As a result, such adverse effects appear that the reliability is insufficient and the package is weak. Therefore, it is necessary to make a review in order to improve the reliability of the electronic component to be further downsized and thinned. The resin-molded package as represented by the semiconductor component is subject to significant change in size. As the product size of the resin-molded package becomes smaller and thinner, maintaining the reliability is difficult and thus is important, which requires new approaches.

FIGS. 7A and 7B illustrate an island including a mounting region on which a semiconductor chip is to be mounted in a semiconductor package, FIG. 7A being a plan view of the island and FIG. 7B being a sectional view of the island (see, for example, Japanese Published Patent Application No. 2006-156437). The island has a considerably larger size than that of the semiconductor chip and includes a plurality of grooves formed in its surface. Referring to the description, each of the grooves has a width of about 0.2 mm and a depth of about 0.1 mm to 0.2 mm, and the grooves are arranged in a grid pattern. Further, the grooves arranged in a grid pattern are formed in a region having a larger size than that of the semiconductor chip. When the semiconductor chip is firmly mounted on the island through intermediation of a silver paste, the silver paste applied at this time enters the groove portions and the excessive silver paste that is further spread to the side peripheral portion of the semiconductor chip is guided into the grooves. Hence, it is possible to reduce the amount of the silver paste creeping up along the side surface of the chip, and prevent the silver paste from creeping up on the semiconductor chip surface.

However, because the island structure described in Japanese Published Patent Application No. 2006-156437 has the grooves in a grid pattern formed in the region having a larger size than that of the semiconductor chip, the island and the region for forming the grooves in a grid pattern always need to have considerably larger sizes than the semiconductor chip size. Hence, a large island size is necessary. This structure is thus not appropriate for the package to which downsizing is required since in downsizing the package in this case it is difficult to design the sizes of the island and the region in the island, which is used for forming the grooves in a grid pattern and which has a larger size than the semiconductor chip, to be close to the semiconductor chip size.

Further, the island structure described in Japanese Published Patent Application No. 2006-156437 has the plurality of grooves formed in a grid pattern each having a width of about 0.2 mm and a depth of about 0.1 mm to 0.2 mm. In a case where the semiconductor chip size is also downsized in the package that is required to be downsized and thinned, when the necessary width of the grooves is 0.2 mm, the semiconductor chip may be mounted in a tilted manner. Further, the thinned package often uses a sheet material having a thickness of 0.2 mm to 0.1 mm or less for the island portion and the lead frame portion. It is thus difficult to form the grooves in a grid pattern each having a necessary depth of about 0.1 mm to 0.2 mm. When the plurality of grooves in a grid pattern each having the width and depth of about 0.2 mm are formed in the island, the difficult processing leads to the increase in the processing cost and processing time. Therefore, the structure described in Japanese Published Patent Application No. 2006-156437 in which the grooves are processed in the island portion is difficult to be applied to the package design that is required to be downsized and thinned and thus increases the cost.

Further, some semiconductor packages include a plurality of semiconductor chips mounted thereon. In a case where the plurality of semiconductor chips are mounted on the island or in a case of a multichip semiconductor product including a further number of semiconductor chips mounted thereon, processing the same number of grooves as that of the semiconductor chips to be mounted on the island portion not only complicates the processing but also further increases the island size and cost. Hence, the application of such a structure tends to be difficult.

Further, an insulating paste is sometimes used as an adhesive for fixing the island portion and the semiconductor chip. Using a silver paste may cause migration of silver due to creeping up in the silver paste and bleed-out in which silver in the silver paste and a resin are separated from each other, which contribute to reduction of the reliability. Thus, more products have used the insulating paste not containing a silver filler. Because no silver filler is contained, the insulating paste has a higher resin ratio as compared to that of the silver paste and thus has a relatively low viscosity in many cases. For this reason, controlling the insulating paste has difficulties as compared to handling the silver paste. Specifically, due to the reduced surface tension, the paste is wet-spread after the application and it is difficult to secure the thickness and set the paste shape to have a hemispherical shape after the application. When the island having the grooves in a grid pattern is applied with the insulating paste, the paste mostly enters the grooves and then is spread around, and hence the insulating paste hardly remains on the fixing contact surface between the island surface and the semiconductor chip. Further, the insulating paste entering the inside of the grooves tends to be pulled by the contacts between the paste and the both side surfaces of the grooves and have a shape with the recessed surface, and hence a clearance is liable to be formed between the semiconductor chip and the island. This leads to an insufficient adhesive strength.

In addition, in a case where the island portion and the semiconductor chip are fixed to each other, because the adhesive thickness obtained when the semiconductor chip is mounted is, in a case of the silver paste, substantially proportional to the silver filler size, the silver paste thickness of at least about 20 μm is formed between the island portion surface and the semiconductor chip. Hence, a sufficient thickness and an adhesive strength can be obtained. When the insulating paste is used, filler is not contained, or silica filler or the like is used in many cases. The thickness obtained owing to the silver filler cannot be secured in this case, and the thickness is equal to or less than 5 μm in many cases even if the filler is contained. Accordingly the paste thickness formed between the island portion surface and the semiconductor chip is as thin as about a few μm, and this tends to reduce the adhesive strength.

Under such circumstances, attempts have been made for devising a processing method and a structure of the island portion that are aimed at improving the adhesive force between the island portion and the semiconductor chip by using the insulating paste or the silver paste. With regard to the structure having the grooves formed therein, the grooves are formed linearly, roundly or in a grid pattern, to thereby improve the adhesive strength of the insulating paste with a lowered viscosity so that it easily flows. Further, another attempt has been made for improving the adhesive strength between the semiconductor chip and the insulating paste by subjecting the island portion surface to roughening processing and forming fine irregularities on the island portion, to thereby improve the adhesive strength between the semiconductor chip and the island surface that are fixed to each other.

SUMMARY OF THE INVENTION

In view of the above description, the present invention has an object to provide a semiconductor device on which a semiconductor chip is firmly mounted by using an insulating paste. The semiconductor device can be downsized and thinned and have high reliability, in which an adhesive strength between a semiconductor chip and an island is improved without processing for a region significantly larger than a semiconductor chip size, the paste is not wet-spread to the outside of the island but remains at an application position, the application shape of the paste is not recessed and no clearance is formed between the semiconductor chip and the fixing surface, and the island portion in a smaller size design can be achieved that is mounted on the fixing area of about the semiconductor chip size.

In order to achieve the above-mentioned object, the present invention uses the following measures.

First, there is provided a semiconductor device, including: an island portion on which a semiconductor chip is adhered through intermediation of an insulating paste; and a plurality of recessed portions each having an inverted pyramid shape, the plurality of recessed portions being formed in a surface of the island portion in a semiconductor chip placing region, in which a first opening angle formed by a normal extending upward from a vertex of each of the plurality of recessed portions each having an inverted pyramid shape and an opening line extending to an outer side of the semiconductor chip placing region is smaller than a second opening angle formed by the normal and an opening line extending to an inner side of the semiconductor chip placing region.

Further, in the semiconductor device, the inverted pyramid shape of the each of the plurality of recessed portions is an inverted regular triangular pyramid.

Further, in the semiconductor device, the semiconductor chip placing region is rectangular, and the plurality of recessed portions each having a square pyramid shape including a bottom surface of a kite square shape is formed at four corners of the semiconductor chip placing region.

Further, in the semiconductor device, the plurality of recessed portions each having an inverted pyramid shape are arranged at a higher density near a periphery of the semiconductor chip placing region than near a center of the semiconductor chip placing region.

Further, in the semiconductor device, the plurality of recessed portions each having an inverted pyramid shape are arranged on an outer edge portion of the semiconductor chip placing region.

Further, in the semiconductor device, the island portion includes a plurality of the semiconductor chip placing regions.

Further, in the semiconductor device, the island portion is formed of a material including any one of a metal, a resin, a ceramic, and a metallized resin.

With the configuration described above, the semiconductor device according to one embodiment of the present invention can be downsized, have high reliability, and design the small-sized island portion on which the semiconductor chip is to be mounted.

DETAILED DESCRIPTION OF THE PREFERRED EMBODIMENTS

First Embodiment

In the following, a semiconductor device according to embodiments of the present invention is described with reference to the drawings.

Figure 1:
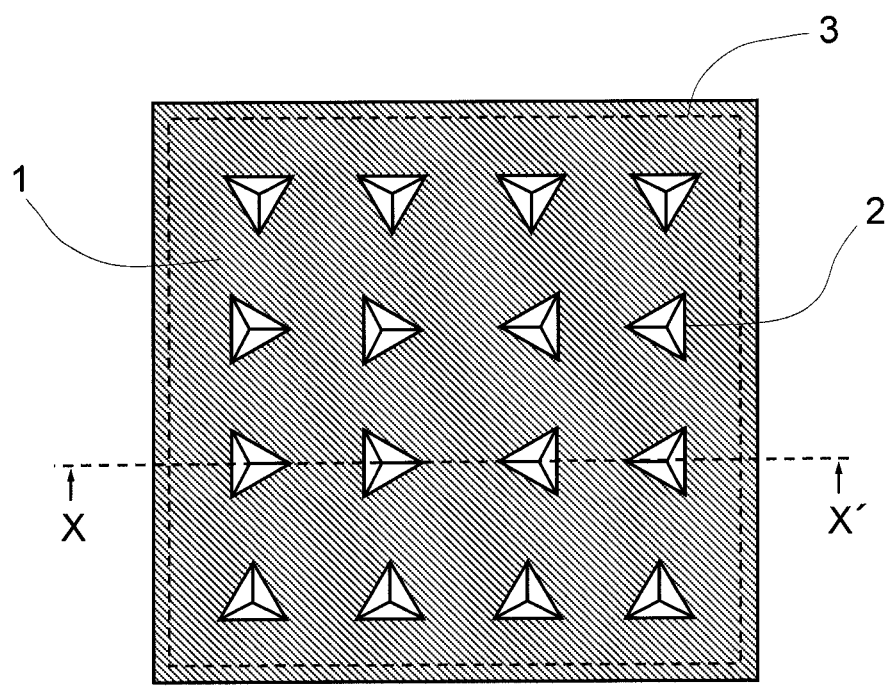
FIG. 1 is a plan view schematically illustrating a semiconductor device according to a first embodiment of the present invention.

FIG. 1 is a plan view schematically illustrating a semiconductor device according to a first embodiment of the present invention. An island portion 1 is a pedestal for fixedly placing (die bonding) a semiconductor chip. Although not illustrated, leads are arranged around the island portion. The leads and the semiconductor chip are connected to each other through wires and then the island portion, the semiconductor chip, the wires, and apart of each of the leads are resin-encapsulated, to thereby form a semiconductor device.

Figure 2:
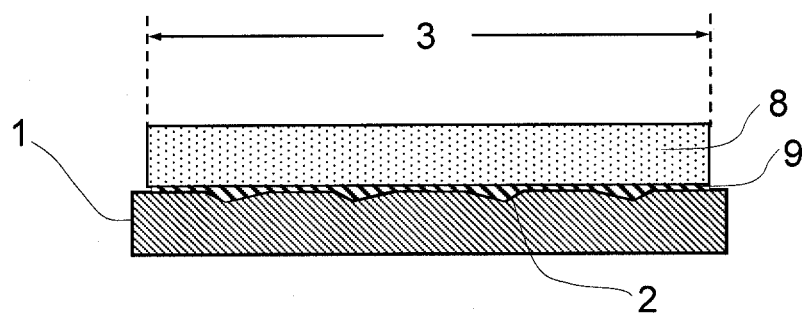
FIG. 2 is a sectional view of placing of a semiconductor chip taken along the line X-X' of FIG. 1.

A plurality of recessed portions 2 each having an inverted pyramid shape are formed in a semiconductor chip placing region provided on a surface of the island portion 1, and the semiconductor chip is fixed to the island portion surface by using an insulating paste. The island portion 1 has a size approximately equal to or slightly larger than that of the semiconductor chip placing region 3 that is fixed to the island surface by using the insulating paste. Further, the recessed portions 2 each having an inverted pyramid shape are formed in the island portion 1 in a smaller region than the semiconductor chip placing region 3 fixed to the island portion 1. The recessed portion 2 having an inverted pyramid shape illustrated in FIG. 1 corresponds to a shape in which a recessed portion obtained by inverting the vertex of a regular triangular pyramid is formed in the surface of the island portion 1. In other words, the recessed portion 2 has a shape in which a recessed portion of an inverted regular triangular pyramid is formed. As illustrated in FIG. 1, the bottom surface of the inverted regular triangular pyramid has an equilateral triangle shape. The recessed portion 2 is arranged so that at least one side of the equilateral triangle faces in parallel to the periphery of the rectangular semiconductor chip placing region 3, which is closest thereto, and the corner of the equilateral triangle opposite to the side faces the inner side of the semiconductor chip placing region 3. FIG. 2 is a sectional view taken along the line X-X' of FIG. 1, illustrating the island portion including the semiconductor chip mounted thereon in cross section.

A semiconductor chip 8 is mounted on the surface of the island portion 1, and fixed thereto through the intermediation of an adhesive 9 such as the insulating paste. The insulating paste 9 applied on the surface of the island portion 1 enters the recessed portion 2 having an inverted pyramid shape, and the adhesion between the island portion 1 and the semiconductor chip 8 is strengthened.

Figure 3:
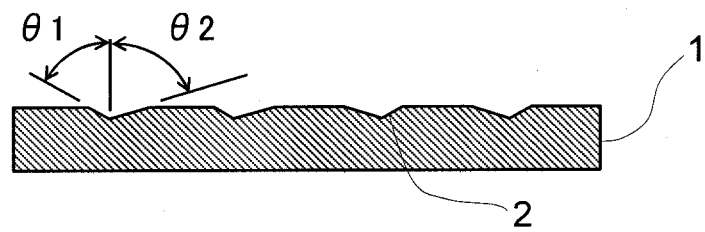
FIG. 3 is a sectional view taken along the line X-X' of FIG. 1.

FIG. 3 is a sectional view taken along the line X-X' of FIG. 1, and the recessed portion 2 of an inverted regular triangular pyramid has a wedged shape when viewed in cross section. An opening angle θ1 formed by a normal extending upward from the vertex of the wedged shape and an opening line extending to the outer side of the semiconductor chip placing region 3 and an opening angle θ2 formed by the normal extending upward from the vertex of the wedged shape and an opening line extending to the inner side of the semiconductor chip placing region 3 have different angles. The opening angle θ1 with respect to the outer side of the semiconductor chip placing region is narrower than the opening angle θ2 with respect to the inner side of the semiconductor chip placing region. If the inverted regular triangular pyramid is a regular tetrahedron, $θ1≈19.5°$ and $θ2=35.3°$ hold.

With such a structure, when the island portion surface is applied with the insulating paste that has a lower viscosity and tends to be wet-spread as compared to the silver paste, the insulating paste tends to be wet-spread within the region for forming the recessed portion 2 having an inverted pyramid shape therein, and can be held in the recessed portion 2 having an inverted pyramid shape. The insulating paste is thus not wet-spread to the outside of the island portion but held. As a result, the insulating paste is held inside of the island portion, and hence when the semiconductor chip is firmly mounted, the insulating paste does not expand beyond the semiconductor chip size and to the outside of the island portion. At the same time, a fillet due to the creeping-up of the paste is not formed on the element side surface, and hence the island portion size does not become considerably larger than the semiconductor chip size. A compact firmly mounting area can be achieved in this way.

Because the recessed portion 2 having an inverted pyramid shape provides, owing to its shape, an effect of partially controlling the surface energy of the applied insulating paste, the held insulating paste easily has a convex hemispherical shape. A clearance is thus hardly formed between the island surface and the semiconductor chip when the semiconductor chip is firmly mounted. In this manner, even when the semiconductor chip is firmly mounted on the downsized island portion 1 by using a paste such as the insulating paste, which has a low viscosity and tends to be wet-spread, the insulating paste neither forms a fillet on the side surface of the semiconductor chip nor expands to the outside of the island portion. Further, a sufficient adhesive strength can be obtained with the fixing area approximately equal to the semiconductor chip size, and an effect of obtaining a package having high reliability can thus be expected.

The recessed portion 2 having an inverted pyramid shape is formed in the semiconductor chip placing region 3 so as to have a depth of few tens of μm, and hence this structure is easily employed even when the thickness of the island portion 1 is thin. Further, when the semiconductor chip is firmly mounted by using the insulating paste, the paste can be different in thickness between the place in which the recessed portion 2 having an inverted pyramid shape is formed and other places and can fix the semiconductor chip and the island portion with different thicknesses depending on the places.

The insulating paste easily has a convex hemispherical shape in the recessed portion 2 having an inverted pyramid shape, has a directivity which is provided by the angle of the vertex of the island portion 1 in the depth direction and with which the insulating paste is hardly wet-spread to the outer side of the island, and is regularly arranged on the smaller region than the semiconductor chip fixing area. Hence, the semiconductor chip can be firmly mounted by the insulating paste wet-spread on the fixing surface with no clearance therebetween. In this manner, even when a design is made so that the island portion 1 and the semiconductor chip are the same in size and the thickness of the island portion 1 is thin, an effect of stably obtaining a high adhesive strength can thus be expected.

The material of the island portion 1 is a metal, a resin, a ceramic, a metallized resin, or the like. Because the depth of the recessed portion 2 having an inverted pyramid shape can be as small as about several tens of μm, it is not difficult to form the recess even when the material, thickness, and size are changed, and the complicated processing is unnecessary. Hence, even when the material and structure of the package are changed, an effect of obtaining a steady adhesive strength can be expected.

Second Embodiment

Figure 4:
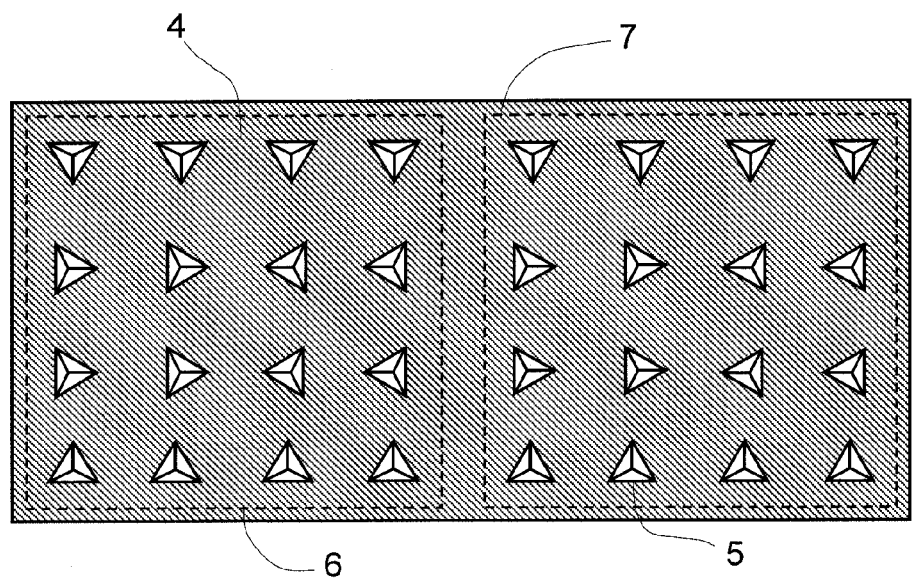
FIG. 4 is a plan view schematically illustrating a semiconductor device according to a second embodiment of the present invention.

FIG. 4 is a plan view schematically illustrating a semiconductor device according to a second embodiment of the present invention.

A semiconductor device often includes a plurality of semiconductor chips mounted on a single island. FIG. 4 illustrates an island portion 4 including two semiconductor chips mounted thereon. When the single island portion 4 includes at least two semiconductor chips mounted thereon, the following firmly mounting structure is applied. Specifically, recessed portions 5 each having an inverted pyramid shape are formed in both regions of places 6 and 7 on the island portion 4 on which the semiconductor chips are to be mounted, and the semiconductor chips are firmly mounted on the surface of the island portion 4 by using the insulating paste. The size of the island portion 4 is increased in proportion to the size and number of the semiconductor chips to be firmly mounted by using the insulating paste. The fixing region between the semiconductor chip 2 and the island portion 4 is set to be approximately equal to or slightly larger than the semiconductor chip size.

When two semiconductor chips are to be firmly mounted on the island portion 4 by using the insulating paste, the insulating paste is applied on places for firmly mounting the semiconductor chips in a fixing area approximately equal to the semiconductor chip size, and the recessed portions 5 each having an inverted pyramid shape are formed in the places for firmly mounting the semiconductor chips in a region equal to or smaller than the semiconductor chip size. The recessed portion 5 having an inverted pyramid shape is formed without the necessity of the complicated processing such as forming grooves in a grid pattern, and hence the recessed portions 5 can easily be applied to the island portion 4 and can be formed in an adjacent manner.

In this case, the insulating paste can be applied on the surface of the island portion 4 in the regions of two places for firmly mounting the semiconductor chips without being wet-spread on the region on which the recessed portions 5 each having an inverted pyramid shape are formed, and the insulating paste can thus achieve the firm mounting without expanding to the outside of the island with respect to the semiconductor chip size. Hence, a sufficient adhesive strength can be obtained. In this manner, the semiconductor chips can be firmly mounted in an adjacent manner, and the size of the island portion 4 can be designed to be small even when the plurality of semiconductor chips is firmly mounted thereon. An effect of downsizing and thinning a package can thus be expected.

Third Embodiment

Figure 5:
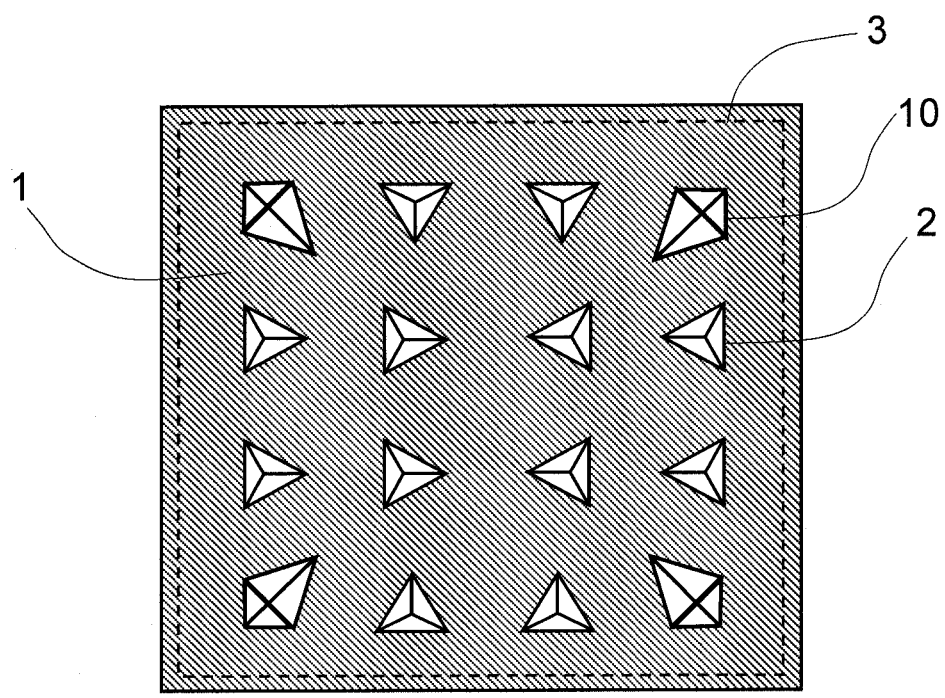
FIG. 5 is a plan view schematically illustrating a semiconductor device according to a third embodiment of the present invention.

FIG. 5 is a plan view schematically illustrating a semiconductor device according to a third embodiment of the present invention.

FIG. 5 differs from FIG. 1 in the following point. Specifically, among the recessed portions each having an inverted pyramid shape of FIG. 1, the recessed portions arranged at the four corners of the semiconductor chip placing region 3 are changed to recessed portions each having a square pyramid shape with a bottom surface having a kite square shape (recessed portions 10). As illustrated in FIG. 5, the kite square shape is obtained by joining the bases of two isosceles triangles having different heights and the same length of bottom surfaces. The recessed portions 10 are arranged so that the corner of the isosceles triangle having a lower height is directed to the four corners of the semiconductor chip placing region 3 whereas the corner of the isosceles triangle having a higher height is directed to the center of the semiconductor chip placing region 3. As a result, with regard to the opening angle of the square pyramid shape from the vertex, the opening angle directed to the four corners of the semiconductor chip placing region is narrower than the opening angle directed to the center of the semiconductor chip placing region. The adhesion between the island portion and the semiconductor chip 8 is further strengthened.

In the above description, as the recessed portion having an inverted pyramid shape, the recessed portion having an inverted triangular pyramid shape or an inverted square pyramid shape is exemplified. However, the inverted pyramid shape may be any inverted polygonal pyramid.

Fourth Embodiment

Figure 6:
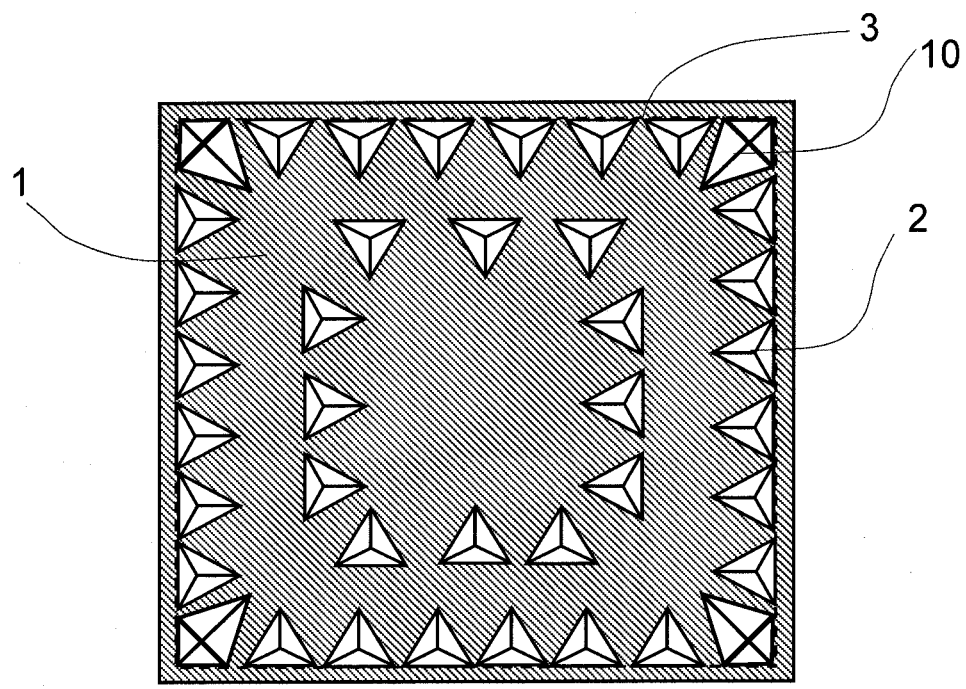
FIG. 6 is a plan view schematically illustrating a semiconductor device according to a fourth embodiment of the present invention.
Figure 7A:
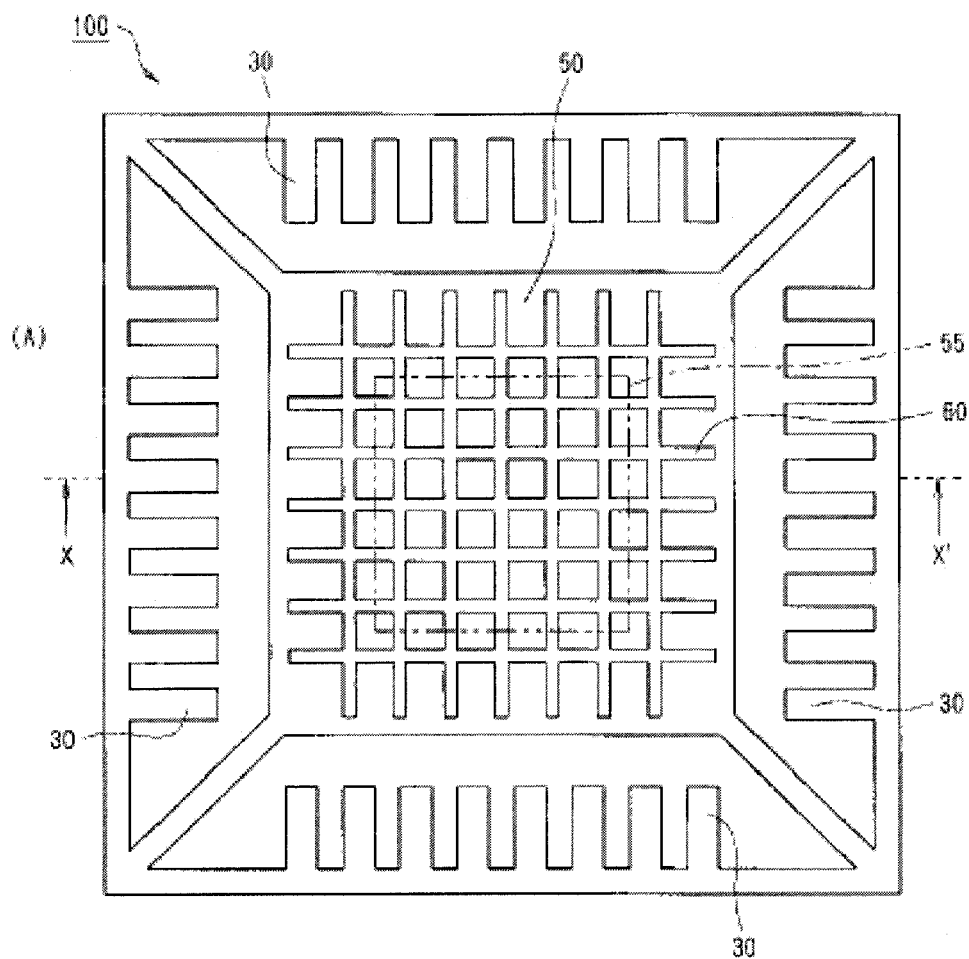
FIGS. 7A and 7B are diagrams schematically illustrating an island portion of a related-art semiconductor device.
Figure 7B:
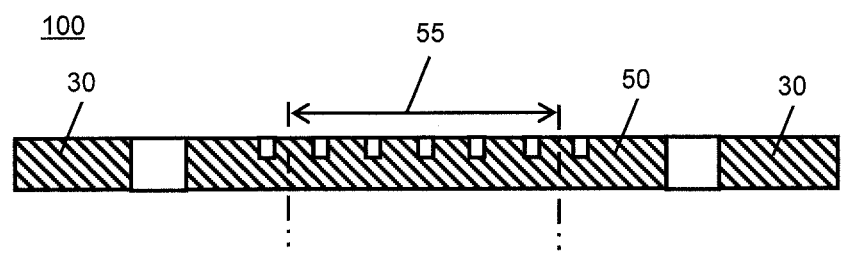

FIG. 6 is a plan view schematically illustrating a semiconductor device according to a fourth embodiment of the present invention.

In the above-mentioned embodiments, the recessed portions each having an inverted pyramid shape are arranged in the semiconductor chip placing region 3 at the same interval. However, in the fourth embodiment, the recessed portions 2 are arranged at a low density near the center of the semiconductor chip placing region 3, whereas the recessed portions 2, 10 are arranged at a high density near the periphery of the semiconductor chip placing region 3. With this arrangement, such an effect is further enhanced that the wet-spreading of the excessive insulating paste is suppressed more near the periphery than near the center of the semiconductor chip placing region 3.

In the embodiment illustrated in FIG. 6, as described above, the recessed portions 2 and 10 each having an inverted pyramid shape are arranged at a low density or at a high density, and the recessed portions 2 and 10 each having an inverted pyramid shape are arranged along the peripheral edge of the semiconductor chip placing region 3.

The semiconductor device in which the semiconductor chip and the island portion surface are firmly mounted by using the insulating paste has the structure in which the plurality of recessed portions each having an inverted pyramid shape are formed in the smaller region than the size of the semiconductor chip to be firmly mounted on the island portion surface. Therefore, the semiconductor chip can be firmly mounted on the island portion surface in the region approximately equal to or slightly larger than the semiconductor chip size by using the insulating paste.

Further, the fixing area between the insulating paste and the island portion surface is approximately equal to the semiconductor chip size, and hence the island portion area can be reduced to a small size that is slightly larger than the semiconductor chip size. In addition, the recessed portion having an inverted pyramid shape is shallowly formed to have a depth of about less than few tens of μm, and hence the complicated processing is unnecessary. It is accordingly possible to easily form the recessed portions in an island having a thin thickness and form the recessed portions in an adjacent manner. Accordingly, this structure can easily be applied to the design in which the plurality of semiconductor chips are firmly mounted on the island portion in an adjacent manner, and can achieve the design for downsizing not only the semiconductor device including a single semiconductor chip mounted thereon but also the semiconductor device including the plurality of semiconductor chips mounted thereon. In this way, this structure can provide the downsized and thinned semiconductor device having high reliability, and hence can contribute to the provision of the device including the semiconductor device mounted thereon, which is represented by a television set, home appliances, a mobile terminal, and the like.

What is claimed is:

1. A semiconductor device, comprising:
   an island portion on which a semiconductor chip is adhered through intermediation of an insulating paste; and
   a plurality of recessed portions each having an inverted pyramid shape, the plurality of recessed portions being formed in a surface of the island portion in a semiconductor chip placing region,
   wherein a first opening angle formed by a normal extending upward from a vertex of each of the plurality of recessed portions each having an inverted pyramid shape and an opening line extending to an outer side of the semiconductor chip placing region is smaller than a second opening angle formed by the normal and an opening line extending to an inner side of the semiconductor chip placing region.

2. A semiconductor device according to claim 1, wherein the inverted pyramid shape of the each of the plurality of recessed portions comprises an inverted regular triangular pyramid.

3. A semiconductor device according to claim 2, wherein the semiconductor chip placing region is rectangular, and wherein the plurality of recessed portions each having a square pyramid shape including a bottom surface of a kite square shape are formed at four corners of the semiconductor chip placing region.

4. A semiconductor device according to claim 1, wherein the plurality of recessed portions each having an inverted pyramid shape are arranged at a higher density near a periphery of the semiconductor chip placing region than near a center of the semiconductor chip placing region.

5. A semiconductor device according claim 1, wherein the plurality of recessed portions each having an inverted pyramid shape are arranged on an outer edge portion of the semiconductor chip placing region.

6. A semiconductor device according to claim 1, wherein the island portion comprises a plurality of the semiconductor chip placing regions.

7. A semiconductor device according to claim 1, wherein the island portion is formed of a material including any one of a metal, a resin, a ceramic, and a metallized resin.

8. A semiconductor device according to claim 1, further comprising a recessed portion having a square pyramidal shape positioned at each of four corners of the semiconductor chip placing region.

9. A semiconductor device according to claim 2, wherein a bottom surface of the inverted regular triangular pyramid has an equilateral triangular shape.

10. A semiconductor device comprising: a plurality of recessed portions formed in a semiconductor chip placing region provided on a surface of an island portion for mounting a semiconductor chip thereon through intermediation of an insulating paste, each of the recessed portions having an inverted pyramid shape and being arranged so that at least one side of the recessed portion faces in parallel to a periphery of the semiconductor chip placing region and a corner of the recessed portion opposite to the at least one side faces an inner side of the semiconductor chip placing region.

11. A semiconductor device according to claim 10, wherein for each of the plurality of recessed portions, the inverted pyramid shape is in the form of an inverted regular triangular pyramid.

12. A semiconductor device according to claim 11, wherein a bottom surface of the inverted regular triangular pyramid has an equilateral triangular shape.

13. A semiconductor device according to claim 10, wherein a first opening angle formed by a normal extending upward from a vertex of each of the plurality of recessed portions and an opening line extending to an outer side of the semiconductor chip placing region is smaller than a second opening angle formed by the normal and an opening line extending to an inner side of the semiconductor chip placing region.

14. A semiconductor device according to claim 13, wherein for each of the plurality of recessed portions, the inverted pyramid shape is in the form of an inverted regular triangular pyramid.

15. A semiconductor device according to claim 10, wherein the plurality of recessed portions are arranged at a higher density near a periphery of the semiconductor chip placing region than near a center of the semiconductor chip placing region.

16. A semiconductor device according claim 10, wherein the plurality of recessed portions are arranged on an outer edge portion of the semiconductor chip placing region.

17. A semiconductor device comprising:
an island portion for mounting a semiconductor chip thereon through intermediation of an insulating paste; and
a plurality of recessed portions formed in each of a plurality of semiconductor chip placing regions of the island portion, each of the recessed portions having an inverted pyramidal shape;
wherein for each of the recessed portions and corresponding semiconductor chip placing region on which the recessed portion is formed, a first opening angle formed by a normal extending upward from a vertex of the recessed portion and an opening line extending to an outer side of the semiconductor chip placing region is smaller than a second opening angle formed by the normal and an opening line extending to an inner side of the semiconductor chip placing region.

18. A semiconductor device according to claim 17, wherein for each of the semiconductor chip placing regions, the plurality of recessed portions are arranged at a higher density near a periphery of the semiconductor chip placing region than near a center of the semiconductor chip placing region.

19. A semiconductor device according claim 17, wherein for each of the semiconductor chip placing regions, the plurality of recessed portions are arranged on an outer edge portion of the semiconductor chip placing region.

20. A semiconductor device according to claim 17, wherein the inverted pyramid shape of the each of the plurality of recessed portions comprises an inverted regular triangular pyramid.

* * * * *